(12) United States Patent
Strauch et al.

(10) Patent No.: US 7,709,398 B2
(45) Date of Patent: May 4, 2010

(54) PROCESS AND APPARATUS FOR DEPOSITING SEMICONDUCTOR LAYERS USING TWO PROCESS GASES, ONE OF WHICH IS PRECONDITIONED

(75) Inventors: Gerhard Karl Strauch, Aachen (DE); Johannes Kaeppeler, Wuerselen (DE); Markus Reinhold, Aachen (DE); Bernd Schulte, Aachen (DE)

(73) Assignee: Aixtron AG (DE)

( * ) Notice: Subject to any disclaimer, the term of this patent is extended or adjusted under 35 U.S.C. 154(b) by 62 days.

(21) Appl. No.: 11/262,874

(22) Filed: Oct. 31, 2005

(65) Prior Publication Data

US 2006/0121193 A1    Jun. 8, 2006

Related U.S. Application Data

(63) Continuation of application No. PCT/EP2004/002994, filed on Mar. 22, 2004.

(30) Foreign Application Priority Data

Apr. 30, 2003    (DE) ................ 103 20 597

(51) Int. Cl.
 *H01L 21/31* (2006.01)
(52) U.S. Cl. .............. 438/758; 438/714; 438/905; 438/727; 438/680; 438/478; 438/487; 438/488; 438/659; 438/676; 438/685; 438/728; 438/787; 438/662; 438/795; 118/715; 118/724; 118/725
(58) Field of Classification Search ........... 438/758; 427/248.1
See application file for complete search history.

(56) References Cited

U.S. PATENT DOCUMENTS 3,672,948 A    6/1972  Foehring et al. ........... 117/106
3,757,733 A    9/1973  Reinberg ................... 118/49.5
4,539,068 A    9/1985  Takagi et al. .............. 156/614

(Continued)

FOREIGN PATENT DOCUMENTS

JP    08167596    6/1996
WO    WO 01/46498    6/2001

OTHER PUBLICATIONS

J.L. Dupuie et al., "The Low Temperature Catalyzed Chemical Vapor Deposition and Characterization of Aluminum Nitride Thin Films" Journal of Vacuum Science and Technology Jan./Feb. 1992, 11 pages, © 1992 American Vacuum Society.
PCT International Search Report, Jul. 9, 2004, 3 pages.

*Primary Examiner*—Fernando L Toledo
*Assistant Examiner*—Ankush k Singal
(74) *Attorney, Agent, or Firm*—St. Onge Steward Johnston & Reens LLC

(57) ABSTRACT

The invention relates to a method and device for depositing at least one layer, particularly a semiconductor layer, onto at least one substrate, which is situated inside a process chamber of a reactor while being supported by a substrate holder. The layer is comprised of at least two material components provided in a fixed stoichiometric ratio, which are each introduced into the reactor in the form of a first and a second reaction gas, and a portion of the decomposition products form the layer, whereby the supply of the first reaction gas, which has a low thermal activation energy, determines the growth rate of the layer, and the second reaction gas, which has a high thermal activation energy, is supplied in excess and is preconditioned, in particular, by an independent supply of energy. The first reaction gas flows in a direction toward the substrate holder through a multitude of openings, which are distributed over a surface of a gas inlet element, said surface being located opposite the substrate holder. According to the invention, the second process gas is preconditioned with a plasma before entering the process chamber, and it enters the process chamber at the edge of the substrate holder directly thereabove and flows parallel to the substrate holder surface.

19 Claims, 9 Drawing Sheets

U.S. PATENT DOCUMENTS

| | | | |
|---|---|---|---|
| 4,540,466 A * | 9/1985 | Nishizawa | 438/708 |
| 4,813,053 A * | 3/1989 | Fisher et al. | 372/86 |
| 5,244,501 A * | 9/1993 | Nakayama et al. | 118/725 |
| 5,314,538 A * | 5/1994 | Maeda et al. | 118/715 |
| 5,350,480 A * | 9/1994 | Gray | 156/345.26 |
| 5,487,785 A * | 1/1996 | Horiike et al. | 118/723 E |
| 5,767,628 A * | 6/1998 | Keller et al. | 315/111.51 |
| 5,871,586 A | 2/1999 | Crawley et al. | 118/715 |
| 5,939,831 A * | 8/1999 | Fong et al. | 315/111.21 |
| 5,958,140 A * | 9/1999 | Arami et al. | 118/725 |
| 6,036,782 A * | 3/2000 | Tanaka et al. | 118/715 |
| 6,132,552 A * | 10/2000 | Donohoe et al. | 156/345.33 |
| 6,289,842 B1 | 9/2001 | Tompa | 118/723 |
| 6,383,896 B1 * | 5/2002 | Kirimura et al. | 438/478 |
| 6,417,111 B2 * | 7/2002 | Nishikawa et al. | 438/710 |
| 6,676,760 B2 * | 1/2004 | Kholodenko et al. | 118/728 |
| 6,835,277 B2 * | 12/2004 | Park | 156/345.33 |
| 6,905,079 B2 * | 6/2005 | Kuwada et al. | 239/13 |
| 7,049,606 B2 * | 5/2006 | Demos et al. | 250/492.2 |
| 7,094,703 B2 * | 8/2006 | Kobayashi | 438/709 |
| 2001/0019889 A1 * | 9/2001 | Sharan et al. | 438/680 |
| 2003/0207032 A1 * | 11/2003 | Ahn et al. | 427/255.34 |
| 2004/0018304 A1 * | 1/2004 | Chung et al. | 427/250 |
| 2004/0033310 A1 * | 2/2004 | Sarigiannis et al. | 427/248.1 |
| 2004/0216665 A1 * | 11/2004 | Soininen et al. | 118/715 |
| 2006/0096531 A1 * | 5/2006 | Ishizaka et al. | 118/715 |

* cited by examiner

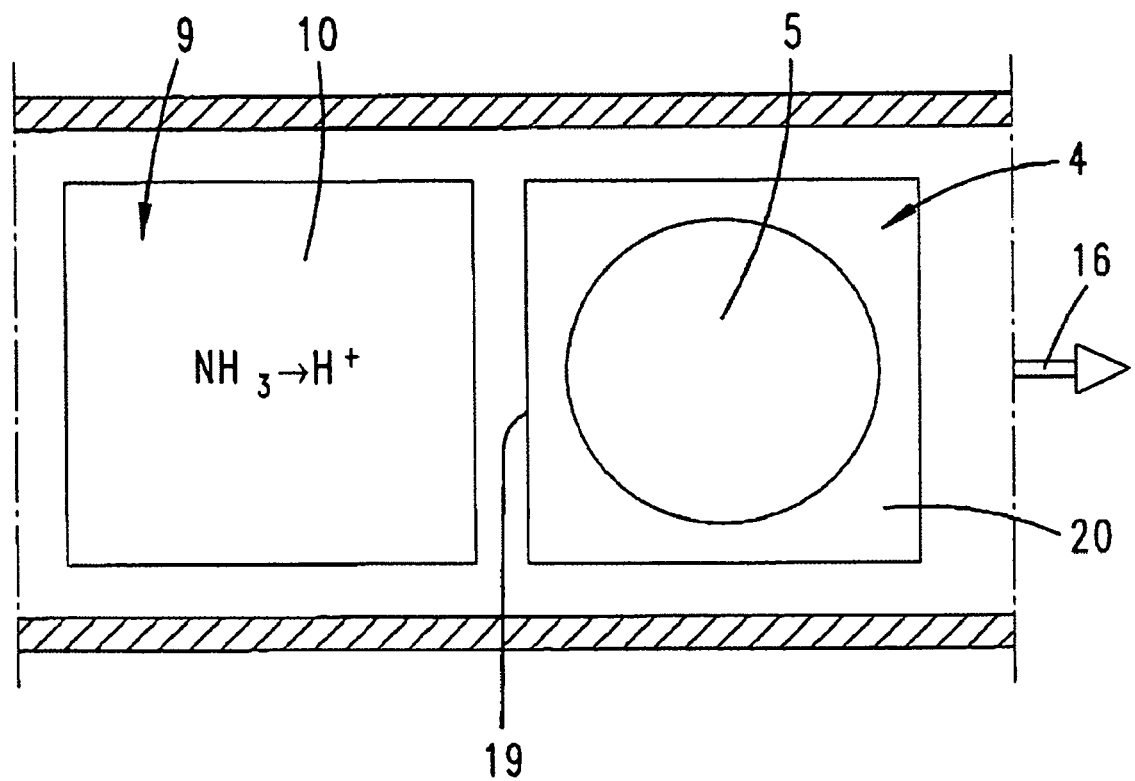

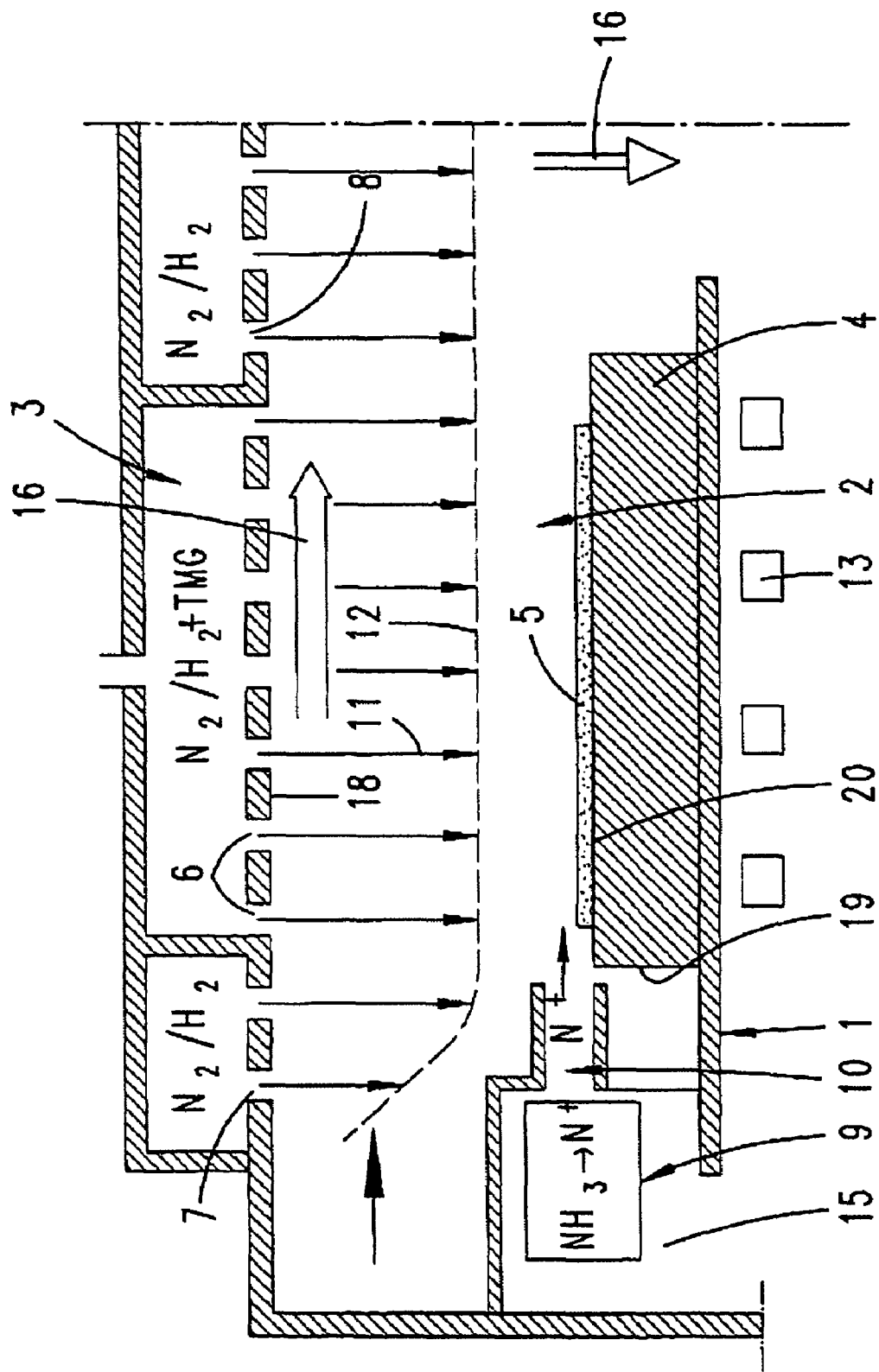

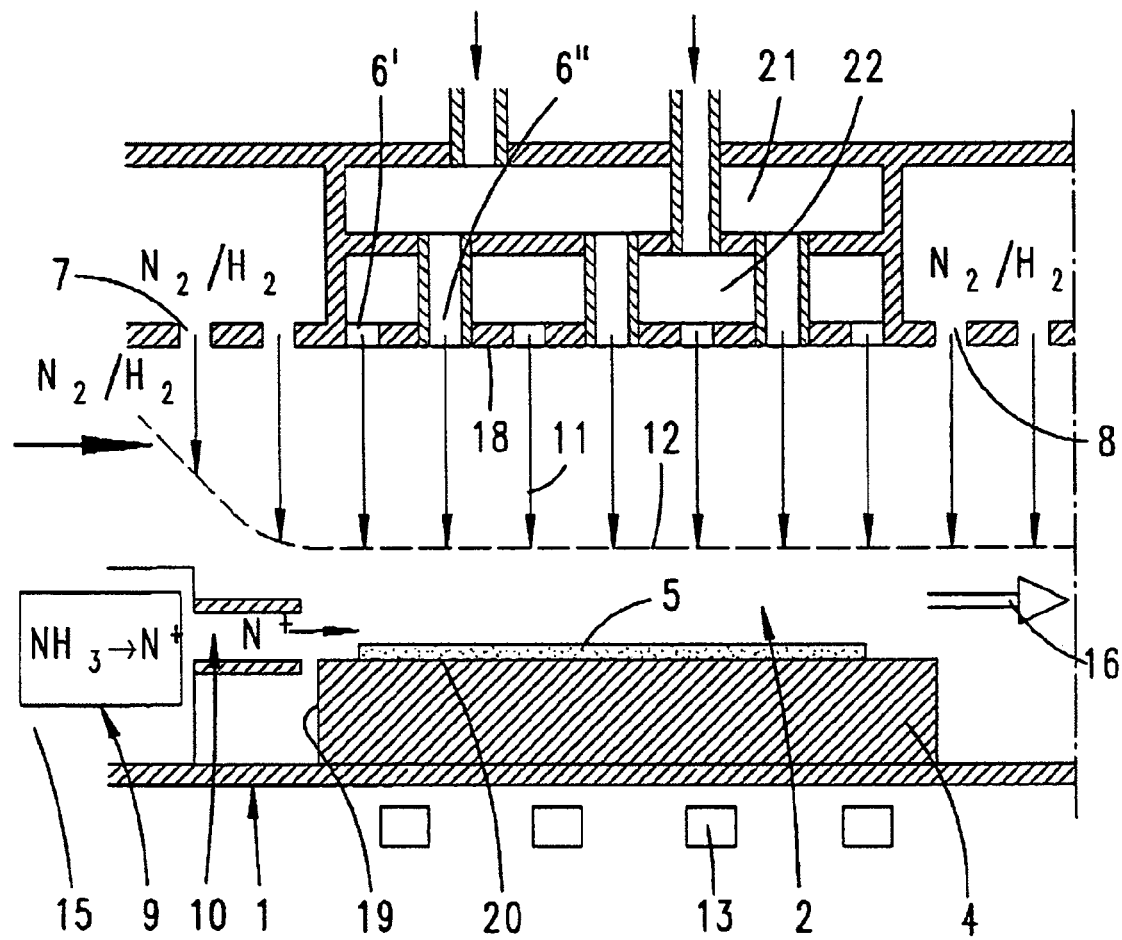

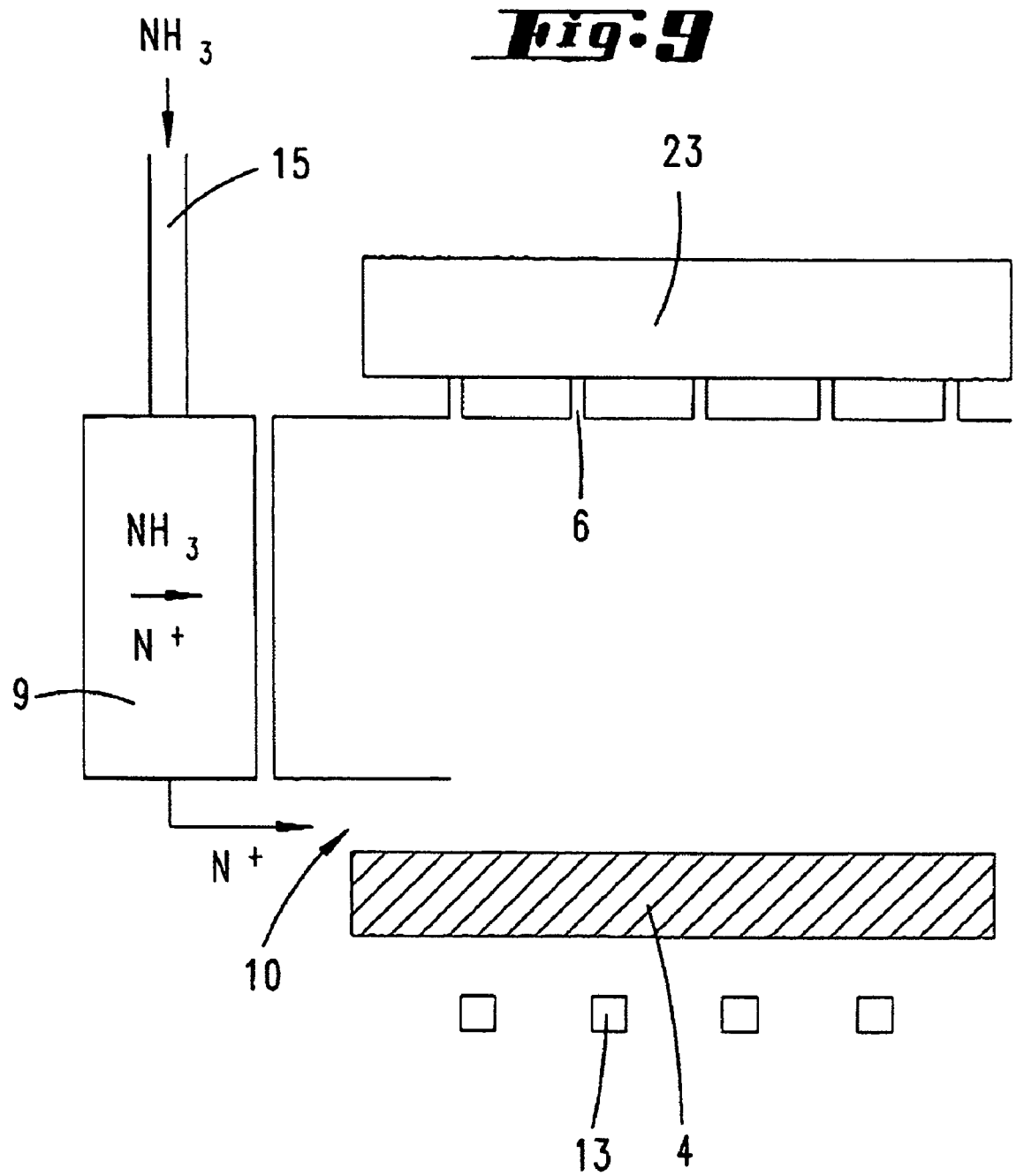

PROCESS AND APPARATUS FOR DEPOSITING SEMICONDUCTOR LAYERS USING TWO PROCESS GASES, ONE OF WHICH IS PRECONDITIONED

PRIOR APPLICATIONS

This application is a continuation of International Patent Application No. PCT/EP2004/002994 filed on Mar. 22, 2004, which designates the United States and claims priority of German Patent Application No. 10320597.7 filed on Apr. 30, 2003.

FIELD OF THE INVENTION

The invention relates to a process for depositing at least one layer, in particular semiconductor layer, on at least one substrate carried by a substrate holder in a process chamber of a reactor, the layer consisting of at least two material components which are in a controlled (fixed or varying) stochiometric ratio and are respectively introduced in the form of a first reaction gas and a second reaction gas into the reactor, where the reaction gases are chemically decomposed as a result of a supply of energy, and some of the decomposition products form the layer, the supply of the first reaction gas, which has a low thermal activation energy, determining the growth rate of the layer, and the second reaction gas, which has a high thermal activation energy, being supplied in excess and in particular being preconditioned by additional supply of energy, the first reaction gas flowing in the direction of the substrate holder through a multiplicity of openings which are disposed distributed over a surface of a gas inlet member lying opposite the substrate holder.

Furthermore, the invention relates to an apparatus in particular for carrying out the process, having a process chamber disposed in a reactor, which process chamber has a substrate holder for at least one substrate, having a heating apparatus for heating the substrate holder to a process temperature, having a gas inlet member, which lies opposite the substrate holder, for introducing a first reaction gas into the process chamber, the gas inlet member having a multiplicity of openings for discharging the first reaction gas, which openings are disposed distributed over the surface of the gas inlet member lying opposite the substrate holder, and having an apparatus for preconditioning a second process gas which is to be introduced into the process chamber.

BACKGROUND OF THE INVENTION

CVD systems, and in particular MOCVD systems, are used to produce light-emitting diodes, in particular green, blue and also white light-emitting diodes. Compound nitrides are deposited on a semiconductor surface in order to deposit white light-emitting diodes. In the production processes used hitherto, first and second process gases, for example in the form of TMG or $NH_3$, have been passed into the process chamber, where the process gases decompose or react with one another, and the reaction or decomposition products are deposited on the surface of a substrate so as to form a layer or layers. The processes used hitherto are expensive, since the outlay on materials, in particular with regard to the nitrogen hydride, is considerably higher than the outlay on materials for the metal alkyl, for example TMG. $NH_3$, $PH_3$ or $ASH_3$ have to be introduced into the process chamber in a concentration which is higher by an order of magnitude than the metal alkyls. Although the hydrides are relatively inexpensive compared to the alkyls, the consumption costs are approximately the same, on account of the high consumption. The high consumption is a result of the high thermal activation energy of the hydrides compared to the activation energies of the metal alkyls.

To promote decomposition of the reaction gases, U.S. Pat. No. 4,539,068 proposes that a plasma be ignited between the gas inlet member and the substrate holder.

U.S. Pat. No. 3,757,733 also proposes a plasma in the process chamber for this purpose.

U.S. Pat. No. 6,289,842 B1 deals with the deposition of semiconductor layers in the MOCVD system, in which the process gases are introduced into the process chamber through a showerhead.

A plasma pre-treatment of a reaction gas is also known from JP 08-167596.

WO 01/46498 describes introducing the alkyls separately from the hydrides.

SUMMARY OF THE INVENTION

Working on the basis of the situation which has been outlined above, whereby the light-emitting diodes produced using the known processes are not in widespread use for cost reasons, the invention is based on the object of providing measures which allow the lumen/cost ratio to be considerably enhanced.

The light yield with respect to the production costs incurred is improved, according to the invention, by virtue of the fact that only the second process gas, which is introduced into the process chamber separately from the first process gas, is preconditioned before it enters the process chamber. The decomposition products enter the process chamber at the edge of the substrate holder, immediately above it, and within the diffusion boundary layer diffuse parallel to the substrate holder surface. The apparatus which is proposed according to the invention for carrying out this process is distinguished by the fact that a preconditioning apparatus is disposed at the edge of the substrate holder for preconditioning purposes. The substrate holder is preferably in the shape of a ring, and the ring can rotate about its center. The preconditioning apparatus is then located in the center of this ring (at the ring inner edge). However, there is also provision for the process chamber to be linear in form or in the shape of a funnel. In this case, the substrate holder is preferably in the shape of a rectangle or a trapezoid. The preconditioning device is then located upstream of the susceptor. The first process gas (metal alkyl), which is preferably trimethylgallium, is introduced into the process chamber through a multiplicity of openings. In this case, the openings are located in the wall which lies directly opposite the substrate holder. The direction in which the gas flows in extends transversely with respect to the surface of the substrate holder. The direction in which the gas flows out extends transversely with respect to the direction in which the gas flows in and parallel to the substrate surface, i.e. parallel to the wall. This wall forms a gas inlet member in showerhead form. Further openings, through which a carrier gas, for example hydrogen or nitrogen, flows into the process chamber, are disposed in the top of the process chamber, upstream and/or downstream of the gas inlet member based on the direction in which the gas flows out, which is oriented parallel to the surface of the substrate holder. The flow of this carrier gas is matched to the flow of the carrier gas which flows in through the openings in the gas inlet member, in such a manner as to form a diffusion/flow boundary layer which is as flat as possible above the substrate holder. In this case, the flow/diffusion boundary layer is as far as possible in the lower half of the process chamber. The preconditioned second process gas is injected into the process chamber in the form of radicals within this diffusion/flow boundary layer. To produce the radicals, the preconditioning apparatus preferably has a plasma generator or a hot-wire apparatus or catalytic device or a combination of the above. This is used to heat the second process gas to temperatures which are such that it decomposes to a high degree.

The openings in the gas inlet member for the first process gas are so close together that the gas jets which emerge from the openings do not strike the substrate holder as individual gas jets, but rather press the second reaction gas, which enters transversely with respect to the direction of these gas jets, flat onto the substrate holder. This allows the amount of material deployed for the second reaction gas to be considerably reduced. Whereas the concentration profile of the first process gas with the low thermal activation energy is substantially flat and constant over the entire length of the substrate holder, the concentration profile of the radicals decreases in the direction of the main gas flow direction. However, in this context it is ensured that the concentration of the radicals is always greater than the concentration of the first process gas immediately above the substrate. On account of this setting, the decomposition products of the second process gas are always present in excess. The growth rate is determined by the supply of the first process gas. The excess supply of the decomposed second process gas means that the layer which is deposited has a low number of EPD defects. The concentration of defects is preferably below $10^{11}$ cm$^{-2}$. On account of this lack of tendency to incorporate defects, it is possible to achieve growth rates which are higher than those of the prior art and in particular also higher than 5 µm/h. According to the invention, the second reaction gas may be a hydride. In particular arsine, phosphine, ammonia or UDMH are suitable. These gases can be almost completely decomposed into radicals by thermal and/or catalytic means in the preconditioning apparatus. Therefore, the mass flow of the second reaction gas introduced into the preconditioning apparatus need only be slightly greater than the mass flow of the first process gas introduced into the gas inlet member. The mass flow of the first process gas, for example TMG, is typically a few sccm, for example 3 sccm. The mass flow of the hydride gas introduced into the preconditioning apparatus is only approximately three times this level.

In addition, it is also possible for a considerably greater mass flow of a carrier gas to be introduced into the gas inlet member. The mass flow of the nitrogen or hydrogen used for this purpose may amount to approximately 30 slm. On account of the virtually complete decomposition of the second process gas within the preconditioning apparatus, the supply of decomposition products of the second process gas in the gas phase immediately above the substrate surface is nevertheless greater than the supply of the decomposed or undecomposed first process gas, which in addition to TMG may also be TMI or other metal alkyls. The process temperatures can be varied within a wide range. They may be between 400° C. and 1600° C. The adverse effect on the temperature profile within the process chamber caused by a thermally preconditioned second reaction gas is negligible, on account of the relatively low mass flow and heat capacity. It is important that the diffusion of the preconditioned hydrides be directed transversely with respect to the alkyl gas stream emerging from a CCS showerhead. The carrier gas which emerges from the showerhead together with the alkyl gas hydrodynamically compresses the flow of the preconditioned hydrides onto the crystal growth surface. The high quantity of carrier gas stream substance resulting from it being fed in via the gas inlet member leads to such a high dilution of the hydrides at the location of the surface of the gas inlet member that the reaction equilibrium for the formation of parasitic deposits on the gas inlet member is well below 1. The result of this is that there can be longer intervals between cleaning of the process chamber than the intervals required in the prior art. On account of the proposal according to the invention, the mass flow of the hydride is reduced by a factor of 100 compared to the prior art. At the same time, this reduces the defect density in the deposited layers, so that light-emitting diodes (GaN) which emit in the UV, produced in this way, can be operated with a higher current, i.e. with a higher light yield.

BRIEF DESCRIPTION OF THE DRAWINGS

Exemplary embodiments of the apparatus according to the invention are explained below on the basis of appended drawings, in which:

FIG. 6 shows an alternative form of reactor, illustrated in the same view as in FIG. 2;

FIG. 7 shows an alternative form of reactor to the reactor according to FIG. 3;

FIG. 8 shows a further alternative for a reactor; and

FIG. 9 shows a further alternative in a highly diagrammatic representation.

DETAILED DESCRIPTION OF THE INVENTION

Figure 1:
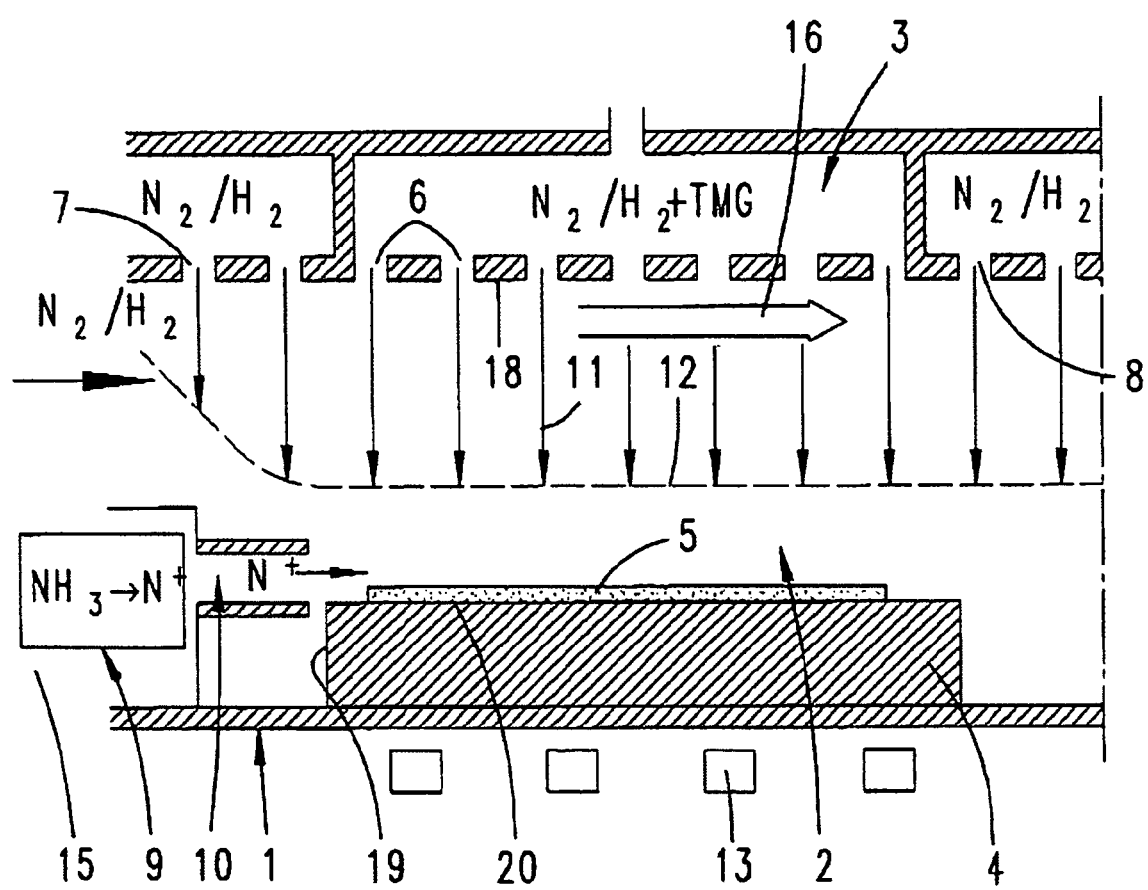
FIG. 1 shows in diagrammatic representation a tunnel reactor with a funnel-shaped process chamber.

The reactor 1 illustrated in FIG. 1 has a housing (not shown). Within the housing of the reactor 1 is a heating device 13 which can be used to heat a substrate holder 4 to process temperature. A substrate, on which a layer is to be deposited, is located on the substrate holder 4. It is also possible for there to be a multiplicity of substrates 5 on the substrate holder 4.

The process chamber 2 is located above the substrate holder 4. The process chamber 2 is delimited at the top by a gas inlet member 3. This gas inlet member 3 forms a gas exit surface 18, which extends parallel to the surface 20 of the substrate holder 4. Gas entry openings 6 are located in the gas exit surface 18 in known manner. These gas entry openings 6 are distributed over the gas exit surface 18 in such a manner that the gas jets which emerge from the gas entry openings 6 and enter the process chamber in the gas inflow direction form a uniform gas flow field in the direction of the substrate holder 4 in a region which is located below the center of the process chamber height. However, an outgoing flow of gas 16, which is oriented transversely with respect to the gas inflow direction 11, is established above the flow/diffusion boundary layer 12.

Further gas entry openings are located upstream of the gas entry openings 6. There are also further gas entry openings 8 downstream of the gas entry openings 6. Whereas not only a carrier gas in the form of $N_2$ or $H_2$, but in particular also the first process gas, in the form of TMG (trimethylgallium) or TMI (trimethylindium) can pass through the openings 6 of the gas inlet member 3, only the carrier gases nitrogen or hydrogen enter the process chamber through the gas entry openings 7, 8 adjacent to these gas entry openings 6, in order to condition the flow/diffusion boundary layer 12 in the edge region above the substrate holder 4 as well, running parallel to the surface 20.

In the exemplary embodiment illustrated in FIG. 6, the substrate holder 4 has a rectangular surface when seen from above. In this case, the process chamber widens in the direction 16 in which the gas flows out. The process chamber has a cross section which remains constant over the entire substrate holder in the direction 16 in which the gas flows out.

Figure 2:
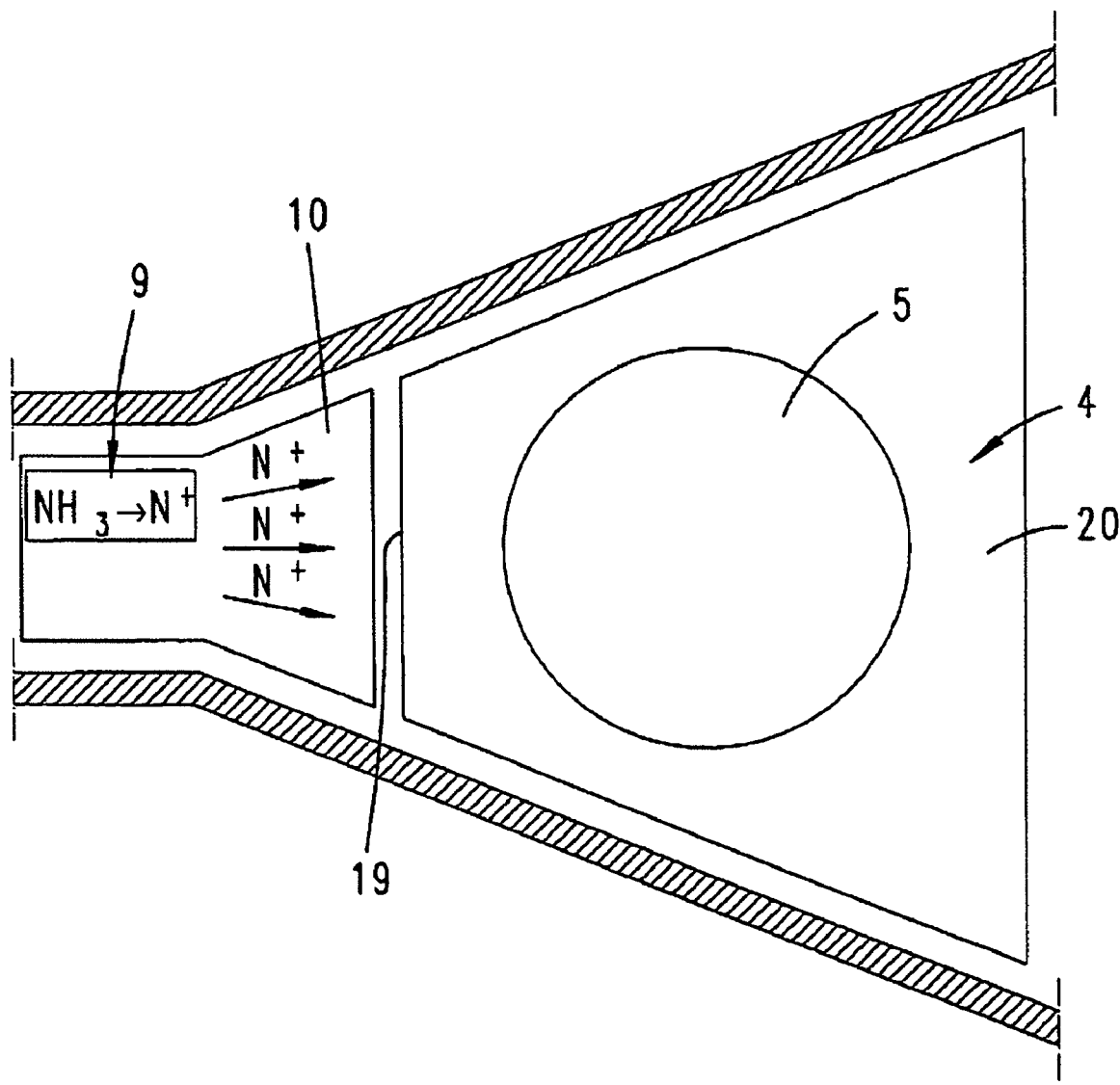
FIG. 2 shows the reactor according to FIG. 1 in plan view onto the substrate holder.
Figure 3:
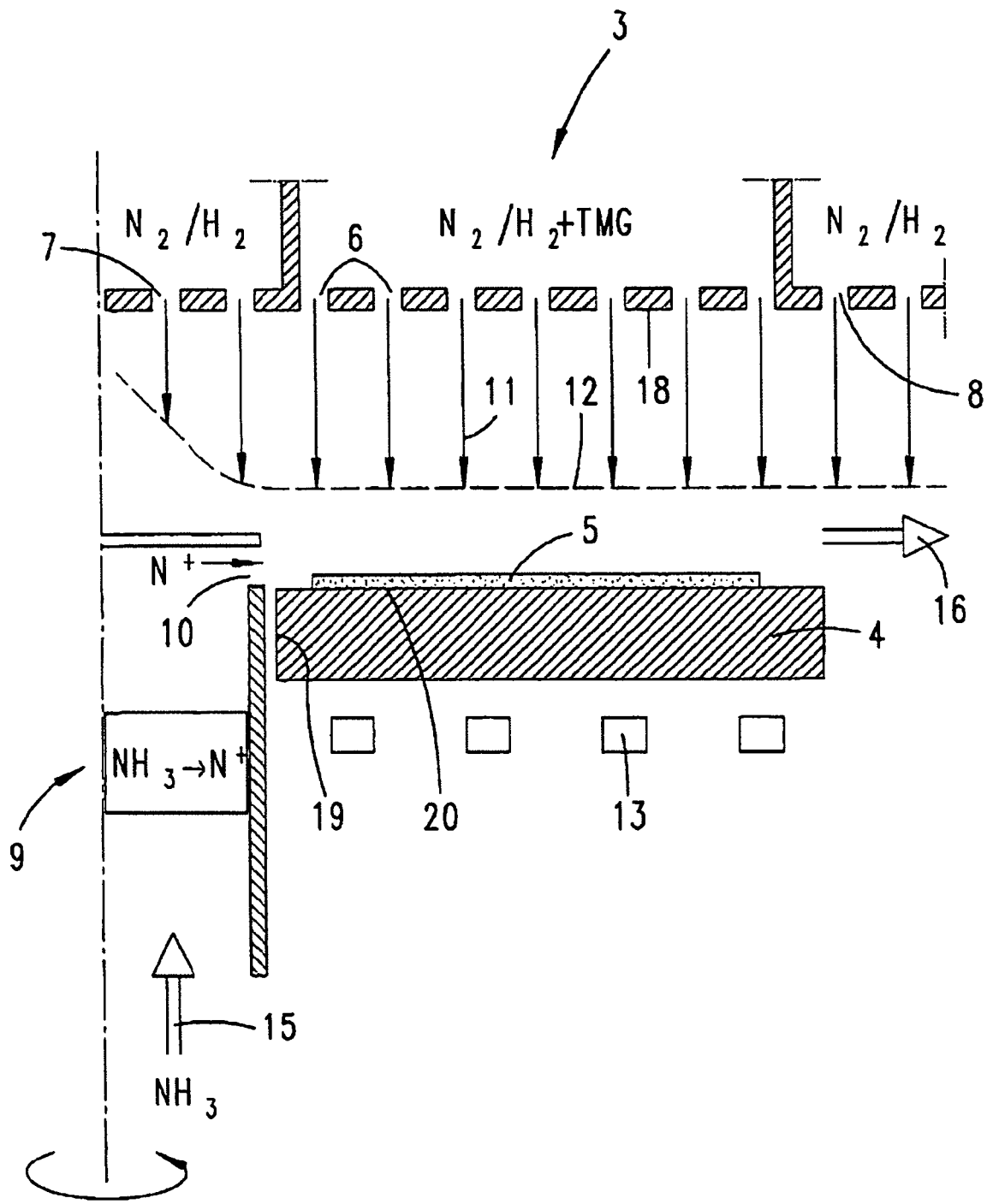
FIG. 3 shows an alternative ring reactor in radial section.

The reactor illustrated in FIG. 3 also has the properties described above. Whereas the substrate holder 4 of the reactor illustrated in FIGS. 1 and 2 is in the shape of a trapezoid, the substrate holder 4 of the reactor illustrated in FIG. 3 is in the shape of a ring. A plurality of substrates 5 are positioned on this ring-shaped substrate holder 4. The substrate holder 4 can be driven in rotation. The substrates lying on the substrate holder 4 can likewise be driven in rotation in known manner. Heating of the substrate holder 4 is effected in known manner, either by means of RF heating or by thermal radiation.

It is important that only the alkyl together with a carrier gas flows into the process chamber 2 through the gas inlet member 3, which is configured in the form of a showerhead. The hydride, which may be $NH_3$, $PH_3$ or $AsH_3$, flows into a preconditioning apparatus 9 via a hydride feedline 15. In the exemplary embodiment illustrated in FIGS. 1 and 2, the preconditioning apparatus 9 is located upstream of an edge 19 of the substrate holder, as seen in the main direction of flow 16. In the exemplary embodiment illustrated in FIG. 3, the preconditioning apparatus 9, only half of which is illustrated in that figure, is located in the center of the annular interior space within the ring-shaped substrate holder 4. In this case, the supply 15 of the hydride can be realized from below.

In the exemplary embodiment illustrated in FIG. 7, the substrate holder 4 is likewise configured in the form of a ring.

In this case too, the injection of the radicals generated by the preconditioning device 9 is effected from the edge 19 of the substrate holder. Unlike in the case of the exemplary embodiment illustrated in FIG. 3, however, the injection takes place from the outer edge, so that compressive diffusion with respect to the substrate surface is formed. This compensates for the depletion profile.

The preconditioning apparatus 9 is only symbolically illustrated in the schematic illustrations. The preconditioning apparatus 9 may be a plasma generator. However, it is preferable for the preconditioning apparatus 9 to be a device for thermal decomposition of the hydride. This may be a "hot wire" device. The hydride is broken down into radicals by means of this device, which has wires that have been heated to high temperatures. The decomposition of the hydride into radicals is preferably virtually complete.

The nitrogen radicals $N^+$ produced in the exemplary embodiment from ammonia in the preconditioning apparatus 9 are passed into the process chamber 2 through an exit passage 10. The exit passage 10 forms an injection opening and opens out into the process chamber, and specifically into the diffusion boundary layer in the chamber, immediately above the surface 20 of the substrate holder 4. The exit passage 10 in this case opens out at the edge of the substrate holder 19. As a result, an $N^+$ stream which extends parallel to the substrate surface 20 and is directed orthogonally with respect to the direction of flow of the gas jets 11 (inflow direction) is formed. The gas jets 11 press the diffusion stream of the nitrogen radicals onto the surface of the substrate 5.

In the exemplary embodiment illustrated in FIG. 3, the apparatus for receiving the preconditioning apparatus 9 is substantially cylindrical in form, with the cylinder being a covered hollow body. In the exemplary embodiment illustrated in FIGS. 1 and 2, the exit passage 10 is configured in the shape of a funnel.

Figure 4:
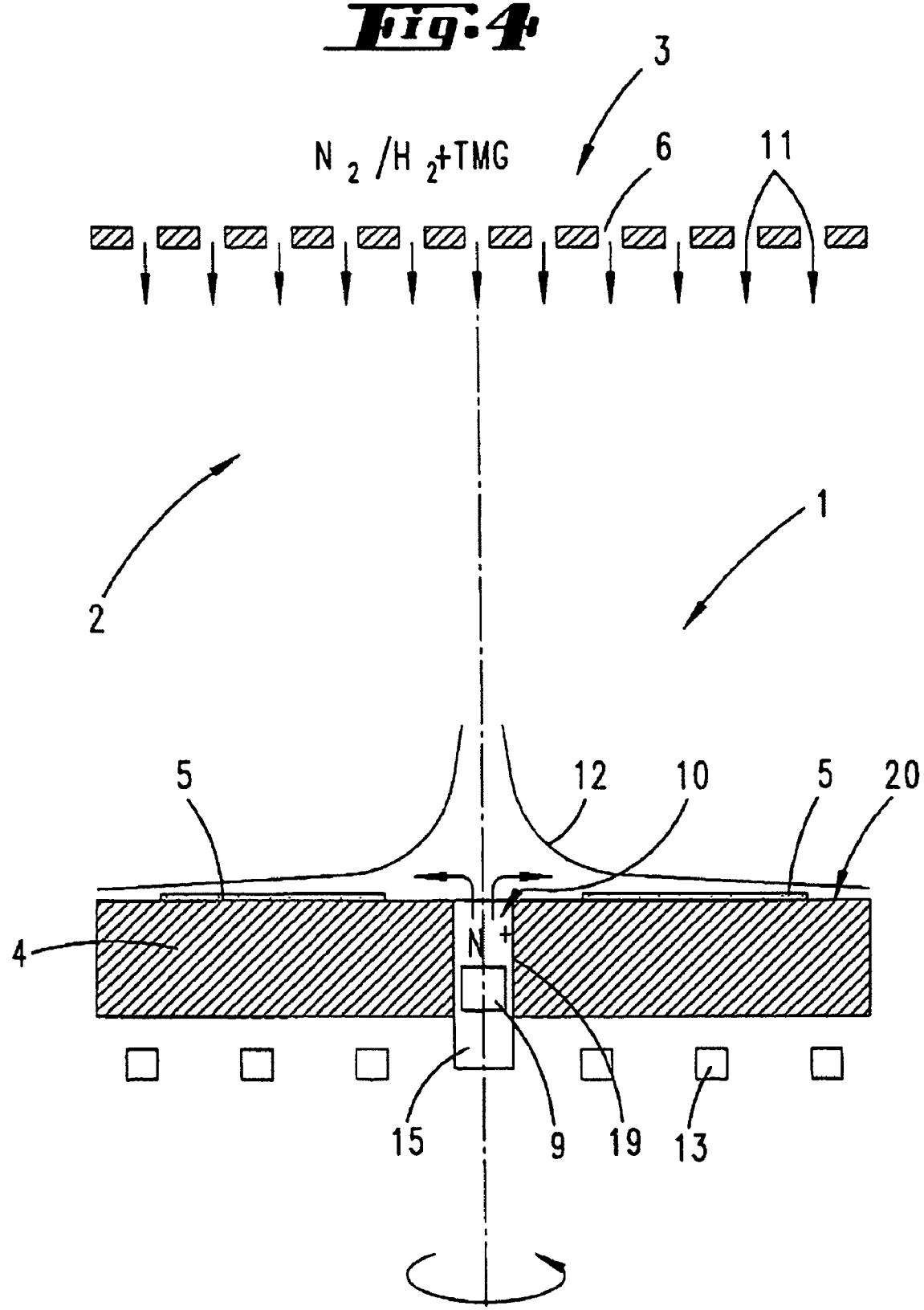
FIG. 4 shows an alternative ring reactor in cross section.

The alternative reactor 1 illustrated in FIG. 4 has a process chamber 2 which is considerably higher than the process chambers of the exemplary embodiments shown in FIG. 1 to 3. To compensate for this, the substrate holder 4, which is likewise ring-shaped, is driven at a higher rotational speed. This leads to the flow/diffusion boundary layer 12 being "pulled flat" above the substrate surface 5. As a result, the device for receiving the preconditioning apparatus 9 does not need to have a cover here. However, in this case too, depending on the process parameters it may be advantageous for there to be a cover. The radicals which emerge from the exit passage 10, which is directed upward, are diverted in the transverse direction with respect to the gas jets 11 and parallel to the surface 20 of the substrate holder by the flow immediately above the exit passage 10.

Figure 5:
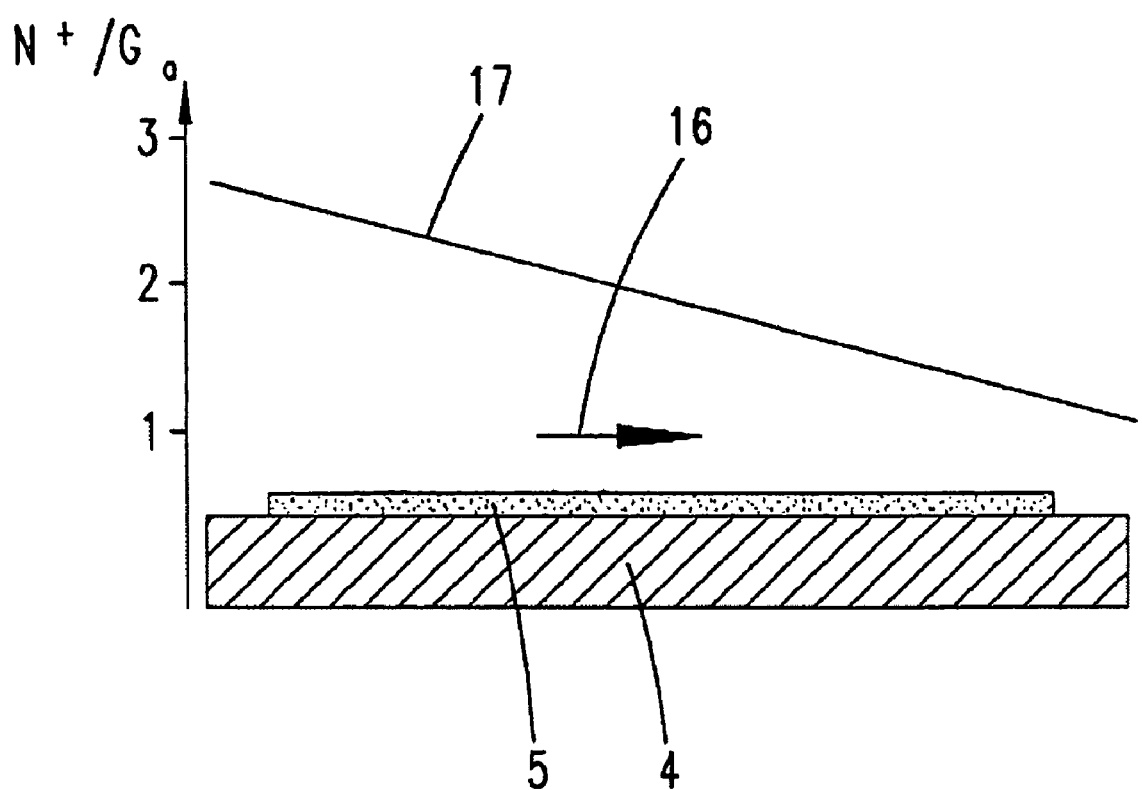
FIG. 5 diagrammatically depicts the concentration of radicals immediately above the substrate surface in the direction of the main gas flow direction.

FIG. 5 shows the concentration profile of the nitrogen radicals $N^+$ which emerge from the exit passage 10 in relation to the gallium concentration in the gas phase above the substrate surface. The nitrogen radicals are present in excess, the concentration 17 of the nitrogen radicals decreasing in the direction of the main gas flow 16. However, the ratio $N^+/Ga$ remains >1 over the entire length (FIGS. 1 and 2) or radius (FIGS. 3 and 4).

At typical process temperatures, which may be 400, 500, 600, 700, 800, 900, 1000, 1100, 1200, 1300, 1400, 1500, –1600° C. and any temperature in between or above, mass flows of trimethylgallium of between 2 and 10 sccm are conducted into the process chamber 2. The mass flow of $NH_3$ which is introduced into the preconditioning apparatus 9 through the line 15 is only at a low level, in particular is only slightly greater than the TMG mass flow, in particular only by a factor of 2 or 3. By contrast, the mass flow of the carrier gas ($H_2$, $N_2$) introduced through the openings 6, 7, 8 is greater by a factor of 1000 than the mass flow of one of the two reaction gases.

The invention can also be implemented using more than two reaction gases. In particular, there is provision for trimethylindium or TMAL or DcpMg to be introduced into the process chamber 2 in addition to trimethylgallium. It is also possible for other alkyls to be introduced there. Furthermore, any other hydride, such as UDMH, can also be introduced into the process chamber instead of or together with $NH_3PH_3$ and/or $AsH_3$. These hydrides are preferably also preconditioned in the manner described above.

The hydrides can be introduced into the preconditioning apparatus 9 in concentrated form or together with a carrier gas. It is preferable for the introduction of the hydrides to be effected with very little carrier gas, in order to minimize dilution of the preconditioned gas. The temperature in the preconditioning device may in this case be higher or lower than the process temperature in the process chamber.

In a variant of the invention which is not illustrated, there is provision for the substrate holders themselves to be driven in rotation. They may in this case rest on a gas cushion driven in rotation. It is preferable for the substrate holders, which are disposed in planetary manner, to rest on individual substrate carriers, which are disposed in the substrate holder 4 so as to be driven in rotation.

In the exemplary embodiment illustrated in FIG. 8, two different alkyls are introduced into the process chamber. In this case, each of the two alkyls is conducted into a separate chamber 21, 22 of the gas inlet member 3. Each of the two chambers 21, 22 is provided with separate gas entry openings 6', 6", which open out into the process chamber. This prevents premature reactions between the individual metal alkyls. Reference is made to U.S. Pat. No. 5,871,586 for details of chambers of this type.

In the further exemplary embodiment illustrated in FIG. 9, the alkyl(s) is/are preconditioned in a special preconditioning device 23. In this case too, the hydrides are preconditioned in a preconditioning apparatus 9. In this case, the supply of the hydrides 15 is effected from above. The preconditioning device 9 is located approximately at the height of the process chamber. However, in this case too, the injection of the radicals is effected through an exit passage 10 which is disposed directly at the edge of the substrate holder 4. The injection of the radicals is effected directly into the diffusion boundary layer.

This further preconditioning device 23 for the alkyls is located in the region of the showerhead immediately in the region of the top of the process chamber. The preconditioned process gas, together with a carrier gas, enters the process chamber through the gas entry openings 6 in the manner described above. The preconditioning apparatus 23 may be a cooling device. The cooling may be effected by a cooling liquid or in some other way, for example by gas streams or by dissipation of heat. The heat can in this case be dissipated by way of an adjustable gas gap.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. Process for depositing at least one layer, in particular semiconductor layer, on at least one substrate carried by a substrate holder in a process chamber of a reactor, the layer comprising at least two material components which are respectively introduced in the form of a first reaction gas and a second reaction gas into the reactor, where the reaction gases are decomposed as a result of a supply of energy and a part of the decomposition products form the layer, the supply of the first reaction gas, which has a low thermal activation energy, determining the growth rate of the layer, and the second reaction gas, which has a high thermal activation energy, being supplied in excess and in particular being preconditioned by independent supply of energy, the first reaction gas together with a carrier gas flowing in the direction generally normal to the substrate holder through a multiplicity of openings which are disposed distributed over a surface of a gas inlet member lying opposite the substrate holder forming together with said carrier gas a flow/diffusion boundary layer above the substrate, said boundary layer being dominated by flow of said carrier gas independently of flow of the second reaction gas, characterized in that the second reaction gas is preconditioned before it enters the process chamber and enters the process chamber at the edge of the substrate holder, immediately above the latter, and flows parallel to the substrate holder surface and is injected into said boundary layer simultaneously with the flow of the first reaction gas, and wherein a part of the decomposition products of both the simultaneously introduced first reaction gas and second reaction gas form the layer.

2. Process according to claim 1, characterized in that the second reaction gas is a hydride, in particular $NH_3$, $PH_3$ or $AsH_3$.

3. Process according to claim 1, characterized in that the second reaction gas is preconditioned thermally and/or catalytically.

4. Process according to claim 1, characterized in that the second reaction gas is preconditioned by means of a plasma.

5. Process according to claim 1, characterized in that the mass flow of the radicals of the second reaction gas formed as a result of the preconditioning into the process chamber is only slightly greater than the mass flow of the first reaction gas into the process chamber.

6. Process according to claim 1, characterized in that the ratio of the radicals formed as a result of the preconditioning to the first process gas directly on the substrate surface is >1 over the entire length of the process chamber or over the entire radius in the process chamber.

7. Process according to claim 1, characterized by such a high supply of the decomposition products of the hydride that growth rates of the layer to be deposited of more than 5 μm/h can be achieved with a high layer quality.

8. Process according to claim 1, characterized by EPDs (etch pit densities) of less than $10^{11}$ cm$^{-2}$, less than $10^9$ cm$^{-2}$, less than $10^8$ cm$^{-2}$ being achievable.

9. Process according to claim 1, characterized by process temperatures of between 400 and 1600° C., preferably in the range between 500° C. and 1200° C.

10. Process according to claim 1, characterized in that the preconditioned second process gas diffuses into the process chamber within a flow/diffusion boundary layer.

11. Process according to claim 1, characterized in that the flow/diffusion boundary layer lies below the center of the height of the process chamber.

12. Process according to claim 1, characterized in that the flow/diffusion boundary layer is conditioned by carrier gas flowing through openings disposed upstream and/or downstream of the openings in the gas inlet member, as seen in the main direction of flow.

13. Process according to claim 1, characterized in that the first reaction gas is TMG, TMI, TEG, TMAL, DcpMg, DEZn or another metal alkyl.

14. Process according to claim 1, characterized in that the flow of the carrier gas which is introduced into the process chamber through the gas inlet member together with the first reaction gas is set in such a way that the flow of the preconditioned second reaction gas is pressed flat onto the substrate surface.

15. Process for depositing at least one layer, in particular semiconductor layer, on at least one substrate carried by a substrate holder in a process chamber of a reactor, the layer consisting of at least two material components which are respectively introduced in the form of a first reaction gas and a second reaction gas into the reactor, where the reaction gases are decomposed as a result of a supply of energy, and some of the decomposition products form the layer, the supply of the first reaction gas, which has a low thermal activation energy, determining the growth rate of the layer, and the second reaction gas, which has a high thermal activation energy, being supplied in excess and in particular being preconditioned by independent supply of energy, the first reaction gas flowing in the direction of the substrate holder through a multiplicity of openings which are disposed distributed over a surface of a gas inlet member lying opposite the substrate holder, characterized in that the second process gas is preconditioned before it enters the process chamber and enters the process chamber at the edge of the substrate holder, immediately above the latter, and flows parallel to the substrate holder surface simultaneously with the flow of the first reaction gas, and wherein a part of the decomposition products of both the simultaneously introduced first reaction gas and second reaction gas form the layer, and further characterized in that the preconditioned second reaction gas is introduced above the surface of the substrate holder and within a diffusion boundary layer, said boundary layer being dominated by flow of a carrier gas independently of flow of the second reaction gas, which carrier gas is introduced together with said first reaction gas through the gas inlet member into the process chamber.

16. A process for depositing at least one semiconductor layer, comprising the steps of:
   providing a substrate holder in a process chamber of a reactor;
   positioning a gas inlet member apart from the substrate holder;
   using a first reaction gas and a second reaction gas;
   wherein the first and second reaction gases are decomposable into first and second material components to form a layer on the substrate consisting said material components;
   introducing said first reaction gas through the gas inlet member into the process chamber;
   preconditioning said second reaction gas by a preconditioning apparatus;
   introducing said preconditioned second reaction gas at an edge of the substrate holder in a generally parallel direction to a surface of the substrate holder into the process chamber simultaneously with the flow of the first reaction gas; and
   decomposing said first reaction gas by applying heat to the substrate holder at a process temperature at which the first and second material form a layer on the substrate consisting said material components, wherein a part of the decomposition products of both the simultaneously introduced first reaction gas and second reaction gas form the layer;
   wherein the preconditioned second reaction gas is introduced above the surface of the substrate holder and within a diffusion boundary layer, said boundary layer being dominated by flow of a carrier gas independently of flow of the second reaction gas, which carrier gas is introduced together with said first reaction gas through the gas inlet member into the process chamber.

17. The process according to claim 16, further comprising the step of introducing the first reaction gas in a generally normal direction toward the surface of the substrate holder.

18. The process according to claim 16, further comprising the steps of
   decomposing the first and second reaction gases with a supply of energy;
   forming the at least one semiconductor layer with at least some of the decomposed first and second reaction gases;
   wherein the first reaction gas has a low thermal activation energy and the second reaction gas has a high thermal activation energy.

19. A process for depositing at least one semiconductor layer, comprising the steps of:
   providing a substrate holder in a process chamber of a reactor;
   positioning a gas inlet member opposite from the substrate holder;
   using a first and a second reaction gas;
   wherein the first and second reaction gases are decomposable into first and second material components to form a layer on the substrate consisting said material components;
   wherein the supply of the first reaction gas determines the growth rate of the layer and the second reaction gas is supplied in excess;
   introducing said first reaction gas through a multiplicity of openings of the gas inlet member in a generally normal direction towards the substrate holder into the process chamber;
   preconditioning said second reaction gas;
   introducing said preconditioned second reaction gas at the edge of the substrate holder in a generally parallel direction to a surface of the substrate holder into the process chamber simultaneously with the flow of the first reaction gas; and
   decomposing said first reaction gas by applying heat to the substrate holder at a process temperature at which the first and second material form a layer on the substrate consisting said material components, wherein a part of the decomposition products of both the simultaneously introduced first reaction gas and second reaction gas form the layer; wherein the preconditioned second reaction gas is introduced above the surface of the substrate holder and within a diffusion boundary layer, said boundary layer being dominated by flow of a carrier gas independently of flow of the second reaction gas, which carrier gas is introduced together with said first reaction gas through the gas inlet member into the process chamber.

* * * * *